United States Patent [19]

Gruner

[11] 4,051,444
[45] Sept. 27, 1977

[54] AMPLIFIER STRUCTURE FOR LOW-LEVEL VOLTAGE MEASUREMENTS

[75] Inventor: Heinz Walter Gruner, Rochester, N.Y.

[73] Assignee: Sybron Corporation, Rochester, N.Y.

[21] Appl. No.: 693,258

[22] Filed: June 7, 1976

Related U.S. Application Data

[60] Continuation of Ser. No. 541,456, Jan. 16, 1975, abandoned, which is a division of Ser. No. 254,000, May 17, 1972, Pat. No. 3,902,366.

[51] Int. Cl.² ............................................. H03F 1/00
[52] U.S. Cl. .................................. 330/68; 174/52 PE
[58] Field of Search ..................... 330/65, 66, 67, 68; 331/67, 68, 69; 174/35 R, 35 TS, 52 PE

[56] References Cited
U.S. PATENT DOCUMENTS

| | | | |
|---|---|---|---|
| 3,390,226 | 6/1968 | Beyerlein | 174/52 |
| 3,870,968 | 3/1975 | Vosteen et al. | 330/207 P |

*Primary Examiner*—James B. Mullins
*Attorney, Agent, or Firm*—Theodore B. Roessel; Joseph C. MacKenzie

[57] ABSTRACT

A magnetic flowmeter system having a high impedance double ended AC preamplifier stage for amplifying voltages induced in a fluid flowing in and transverse to the field of an AC energized electromagnet. The preamplifier output voltages are amplified in a single-ended AC amplifier. The output voltage of the AC amplifier is demodulated by a phase sensitive detector. The DC output voltage is divided by a DC voltage derived from the AC source of energization for the electromagnet, so a net output voltage results which is free of common mode and quadrature voltages and independent of field fluctuations, but is obtained without feedback to the input of the system.

6 Claims, 4 Drawing Figures

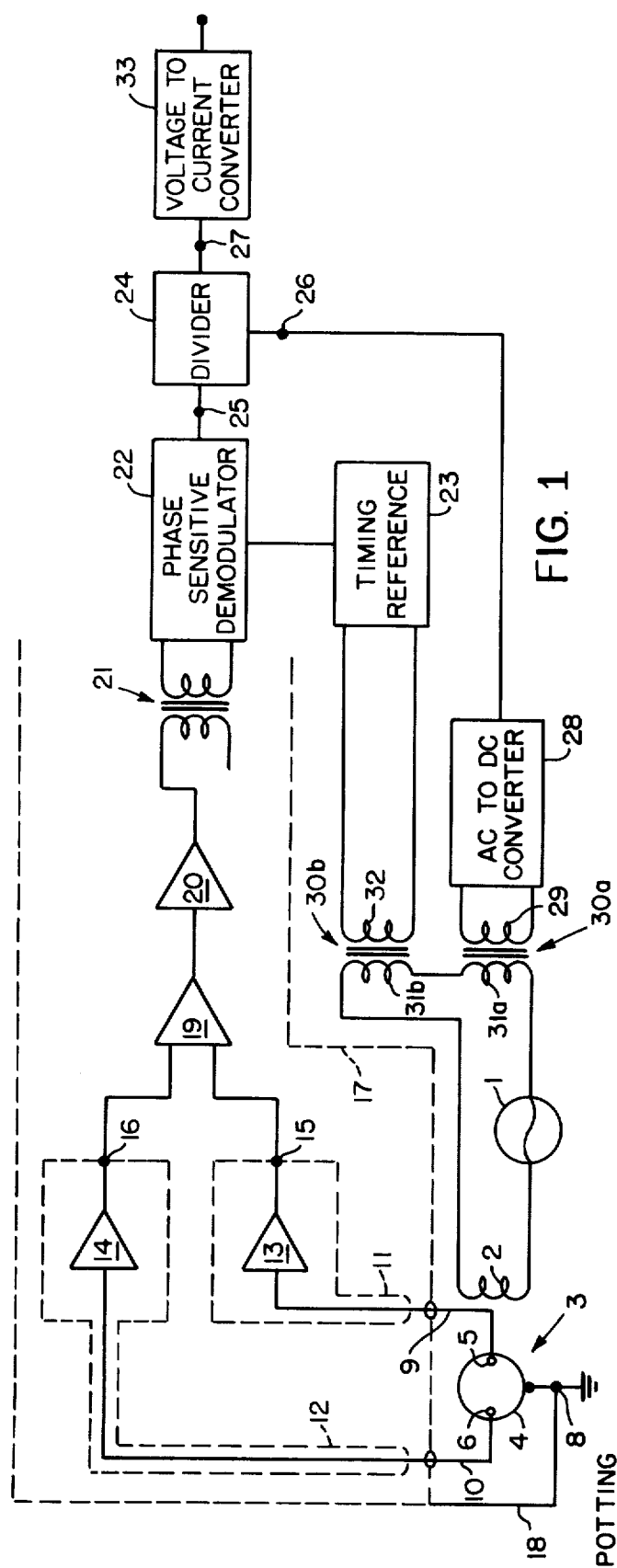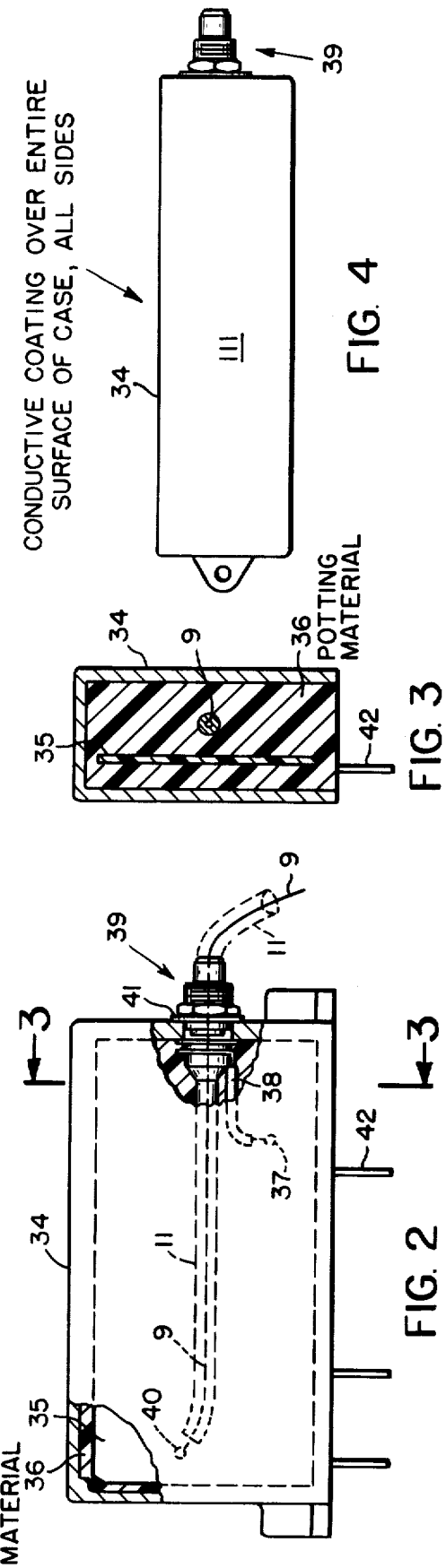

AMPLIFIER STRUCTURE FOR LOW-LEVEL VOLTAGE MEASUREMENTS

RELATED APPLICATIONS

The present application is a continuation of abandoned application Ser. No. 541,456, filed Jan. 16, 1975, said abandoned application having been a division of application Ser. No. 254,000, filed May 17, 1972, and now U.S. Pat. No. 3,902,366, issued Sep. 2, 1975.

FIELD OF THE INVENTION

The invention is in the field of amplifier structure for low-level voltage measurements, especially in so-called magnetic flow-meters wherein volumetric rate of flow is measured on the basis of the voltages induced by fluid flow through and transverse to a magnetic field. A common problem here is that the induced voltages due to flow are usually a minor component of the total voltage actually sensed in the fluid.

DESCRIPTION OF THE PRIOR ART

The solution to the aforesaid problem has generally involved using amplifier techniques to deal with the total voltage sensed in the fluid in order to get rid of common mode and quadrature components and the influence of fluctuations in the magnetic field. Also, shielding, and various structure or structural arrangement of amplifiers, designed to improve pick-up of the desired voltages, have been provided, in order to minimize pick-up of unwanted signals.

SUMMARY

In a system incorporating the present invention, operational amplifier techniques are used and the overall system is entirely open-loop, to avoid the effects of phase and frequency selective feedback on the original level of the flow-induced voltages. Common mode and quadrature voltages, and the influence of the magnetic field are eliminated or reduced. In addition the voltages initially picked up are kept free of all other influences by appropriate packaging, provided by the present invention of low level amplifier parts of the system.

In brief, the input lead of an unfedback voltage amplifier is enveloped in a driven shield, and the amplifier (including its structure, such as input and output leads, potting, circuit board and input and output terminals) are enveloped by a futher shield, which is conveniently part of a case containing the amplifier and associated structure, and also electrically part of the input lead shield which is driven from the output of the amplifier.

BRIEF DESCRIPTION OF THE DRAWINGS

FIG. 1 is a diagram of a magnetic flowmeter system in which the present invention is particularly intended to be incorporated;

FIGS. 2, 3 and 4 are illustrations, partly in section, of the structural arrangement according to the present invention of low level portions of a magnetic flowmeter system, such as shown in FIG. 1.

DESCRIPTION OF THE PREFERRED EMBODIMENT

In FIG. 1, an AC source 1 energizes the magnetic field generating structure, represented by the coil 2, of a flow transducer 3 having a short section 4 of conduit having electrodes 5 and 6 mounted inside the section 4. The section 4 is either non-conductive, or is conductive and has a non-conductive lining therein, and, in the latter case, the electrodes 5 and 6 are insulated from the section 4, but in any event there will be in effect a connection of the fluid in the pipe to ground, as, for example, via terminal 8.

Conductive leads 9 and 10, enveloped in conductive shields 11 and 12, connect electrodes 5 and 6 to the inputs of amplifiers 13 and 14. Shields 11 and 12 extend around the amplifiers and connect to the outputs of the amplifiers at terminals 15 and 16 respectively.

An outer shield 27, having a lead 18 conductively connecting it to ground terminal 8 encloses leads 9 and 10, shields 11 and 12, and at least amplifiers 13 and 14, and 19 and 20, as indicated by the open-ended depiction of the shield 17. In practice, shield 17 commonly includes, electrically speaking, a metal casing enveloping section 4, and field structure 2. If the amplifiers 13 and 14, etc., are also enclosed in such casing, then this last is the entire shield. While for convenience shields 11, 12 and 17 have been drawn so as to leave some of the leads 9 and 10 outside them, in any case, said shields will envelop them entirely. Naturally, shield 17 has only capacitive and inductive coupling to the amplifiers and their input and output leads. Likewise, shields 11 and 12 have, at most, only capacitive and inductive coupling to one another, and to amplifiers 13 and 14, leads 9 and 10, section 4, etc. Amplifiers 13 and 14 can amplify the voltages on leads 9 and 10 enough to bring them to a level high enough that the effects of stray fields and other electrical vagaries of the environment will not be significant. On the input end, however according to the present invention where the voltage levels are quite low, the shields 11, 12 and 17 ward off such effects, partly by reason of grounding 17, and partly by the connections of shields 11 and 12 to the amplifier outputs, which, as is well known, minimizes capacitive coupling of unwanted signal to the amplifiers through the shielding itself.

The voltages at terminals 15 and 16 represent the voltages with respect to ground, of electrodes 5 and 6, respectively. All these voltages are low level AC voltages, only one component of which is induced by flow through the alternating magnetic field produced by structure 2. (It is to be supposed that the flow is that of a liquid of very low conductivity, perpendicular to the paper and within the outline of section 4; and that the direction of the field is along the horizontal of the Figure and through section 4). The other components of the voltages at terminals 15 and 16 are common mode and quadrature voltages, and all components reflect fluctuations in the voltage of source 1. In addition, at low flows, the flow component may be small compared to the total of the other components.

In order to get rid of the common mode components, the voltages at terminals 15 and 16 are applied to the input terminals of a conventional differential amplifier 19, the output voltage of which is connected to a single ended amplifier 20, in order to further raise the signal level. Amplifiers 19 and 20 are AC coupled and are preferably highly stabilized by local feedback in each thereof.

It will be observed that thus far the amplifying system as a whole is open loop, and, in fact, as will be seen later, it is open loop all the way through, unless for local feedback such as in amplifiers 19 and 20. The reason for this is that when the ratio of flow signal to all other sorts of signal in the low end of the system is sufficiently low, say 1 to 1 or less, feedback to low levels is simply a waste of flow information as any practical sort of overall, phase and frequency selective feedback arrangement would suppress flow information signal levels so much, that the said ratio would decrease to 1 to 10,000 or less, depending on the feedback ratio.

From above-identified patent relating to and describing the system of FIG. 1 in detail, it will be seen that the open loop character of the system makes for great simplicity and straightforwardness, mainly due to the absence of system feedback features, which would pose difficult design problems, the solutions of which would be chronic sources of problems themselves, during use of the system. However, one of the crucial elements of an open loop system is according to the present invention, extraction of the original signal from the electrodes 5 and 6. According to the present invention, this crucial element is provided for by the structural arrangement for low level amplifier parts of the system, as shown in FIGS. 2, 3 and 4.

In FIG. 2 a more or less rectangularly parallelepipedal polypropylene case 34 houses a miniature circuit board 35, upon which is located one only of the amplifiers 13 and 14, say 13. As will be seen from FIG. 3, which is an end elevation of case 34, sectioned on plane 3—3 of FIG. 2, the circuit board is solidly potted into the case, by potting material 36. Connection to the output of the amplifier 13 is made at an eyelet of the board 35, from whence a wire 38 connects to the external (and conventional) mounting hardware 39 of the connector which forms electrically part of the outer conductor of the connector. As will be seen from the drawing, shield 11 is electrically continuous with said outer conductor and extends all the way to an eyelet 40 which in effect is the input terminal of amplifier 13. (It is to be supposed, of course, that in FIG. 2 we are looking into the interior of case 39, in the absence of potting material, and at the underside of the circuit board, at the broken upper left corner of the case). Lead 9 is continuous with the center conductor of the connector, and so goes into the eyelet 40. Shield 11 also extends around the case 34 in the form of a conductive coating 111 sprayed on or otherwise incorporated in the outer surface of case 34 (including its cover). The coating extends under the mounting hardware (e.g., under metal washer 41) so that when the hardware is tightened up a good DC contact exists between the coating and the connector hardware. The rest of lead 9 and shield 11 extend from the connector to the electrode 5 (Not shown in FIG. 2).

The amplifier 14 is packaged the same way, and it and amplifier 13 are of course also enveloped in the outer shield 17, as, for example, within metal casing structure incorporating the section 4, its field structure and electrodes. Power supply and other connections may be provided for by leads coming out of the case 34 through its bottom, for example, the connection to amplifier 19 may be made through bottom lead 41.

The described structural arrangement has been found to insure that the output voltages remain substantially free of all information except that which the rest of the system is designed to deal with. At the same time, the structural arrangement is economical, desirable, and substantially fool proof, since once the module is complete, it is impossible to tamper with its contents short of damaging them beyond repair.

Having described my invention in accordance with 35 USC 112, I claim:

1. An amplifier module having amplifier structure, shielding structure, and housing structure;
   said amplifier structure including an input lead, an output lead, and a circuit board for carrying an amplifier whose input terminal and output terminal are connected to said leads for amplifying an input voltage from a source of low-level voltage applied to said input lead and producing a corresponding output voltage on said output lead, said circuit board including said terminals of said amplifier;
   said shielding structure comprising an electrically conductive shell enveloping said input lead and said circuit board;
   said housing structure including a body of electrically-insulating potting material enveloping said circuit board, said body substantially filling said shell, and said body having said input lead and said output lead both extending therefrom;
   said shell having an electrically-conductive input lead shield DC-connected to said shell; said input lead shield extending from within said shell to said source, said input lead shield extending into said body to said input terminal, and said input lead shield enveloping said input lead, but being electrically insulated therefrom;
   said shell being DC-connected to said output lead for maintaining said input lead shield and said shell at the potential of said output voltage.

2. The amplifier module of claim 1 wherein said housing structure includes electrically-conductive mounting hardware externally of said body;
   said input lead shield including said hardware as an electrically-conductive part thereof, and extending from said hardware both internally and externally of said body;
   said shell and said output lead being electrically-conductively secured to said hardware, and said input lead extending internally and externally of said body through said hardware.

3. The amplifier module of claim 1, said shielding structure being a conductive coating on the external surface of said housing structure.

4. The amplifier module of claim 1, said housing structure including an electrically-insulating case, said shell being on the exterior of said case and said body being within said case.

5. The amplifier module of claim 4, wherein said housing structure includes electrically-conductive mounting hardware in the wall of said case;
   said output lead being in said case and electrically-conductively secured to said hardware 6. The amplifier module of claim 4, wherein said housing structure includes electrically-conductive mounting hardware in the wall of said case,
   said output lead being in said case and electrically-conductively secured to said hardware;
   said input lead shield having said hardware as an electrically-conductive element thereof, said input lead extending out of said module through said hardware.

* * * * *